(12) United States Patent
Park et al.

(10) Patent No.: US 10,079,598 B2
(45) Date of Patent: Sep. 18, 2018

(54) GATE DRIVING CIRCUIT AND DISPLAY DEVICE INCLUDING THE SAME

(71) Applicant: Samsung Display Co., Ltd., Yongin-si, Gyeonggi-do (KR)

(72) Inventors: Jun Hyun Park, Yongin-si (KR); Sung Hwan Kim, Yongin-si (KR); Se Young Song, Yongin-si (KR); Kyoung Ju Shin, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 194 days.

(21) Appl. No.: 15/048,979

(22) Filed: Feb. 19, 2016

(65) Prior Publication Data

US 2016/0293094 A1    Oct. 6, 2016

(30) Foreign Application Priority Data

Mar. 30, 2015   (KR) ........................ 10-2015-0044490

(51) Int. Cl.
*G11C 19/28*   (2006.01)
*G09G 3/20*    (2006.01)
*G11C 19/18*   (2006.01)
*H03K 17/687*  (2006.01)

(52) U.S. Cl.
CPC ........... *H03K 17/6871* (2013.01); *G09G 3/20* (2013.01); *G11C 19/184* (2013.01); *G11C 19/28* (2013.01); *G09G 2310/0267* (2013.01); *G09G 2310/0286* (2013.01)

(58) Field of Classification Search
CPC ................. H03K 17/6871; G09G 3/20; G09G 2310/0267; G09G 2310/0286; G11C 19/184; G11C 19/28
See application file for complete search history.

(56) References Cited

U.S. PATENT DOCUMENTS 9,774,846 B2 *  9/2017  Kim ................... H04N 13/0497
2006/0132182 A1  6/2006  Kikuchi
2007/0192659 A1  8/2007  Kang et al.
(Continued)

FOREIGN PATENT DOCUMENTS

JP        2006-178165 A    7/2006
KR   10-2010-0075141 A    7/2010
(Continued)

*Primary Examiner* — Julie Anne Watko
(74) *Attorney, Agent, or Firm* — Lewis Roca Rothgerber Christie LLP

(57) ABSTRACT

A gate driving circuit includes: a plurality of stages configured to output a plurality of gate signals, wherein an Nth stage of the plurality of stages includes: an output pull-up unit including a control electrode connected to a first node, wherein the output pull-up unit is configured to increase an electric potential at the first node and is further configured to receive a clock signal and to output a gate signal of the Nth stage; a control node pull-up unit configured to charge the first node according to an (N−1)th control signal and an (N−2)th control signal; a control node pull-down unit configured to discharge a voltage of the first node as a first low voltage according to an (N+1)th control signal; and an output pull-down unit configured to discharge a gate signal of the Nth stage as the first low voltage according to the (N+1)th control signal.

19 Claims, 8 Drawing Sheets

(56) References Cited

U.S. PATENT DOCUMENTS

| | | | |
|---|---|---|---|
| 2010/0156474 A1* | 6/2010 | Park | G09G 3/3677 |
| | | | 327/108 |
| 2010/0277206 A1 | 11/2010 | Lee et al. | |
| 2012/0056860 A1 | 3/2012 | Umezaki et al. | |
| 2015/0042689 A1* | 2/2015 | Kim | H03K 3/012 |
| | | | 345/690 |
| 2016/0240129 A1* | 8/2016 | Kim | G09G 3/2092 |
| 2017/0032756 A1* | 2/2017 | Kim | G09G 3/3648 |

FOREIGN PATENT DOCUMENTS

| | | |
|---|---|---|
| KR | 10-2010-0119119 A | 11/2010 |
| KR | 10-2013-0129124 A | 11/2013 |

\* cited by examiner

GATE DRIVING CIRCUIT AND DISPLAY DEVICE INCLUDING THE SAME

CROSS-REFERENCE TO RELATED APPLICATION

This application claims priority to and the benefit of Korean Patent Application No. 10-2015-0044490, filed on Mar. 30, 2015, in the Korean Intellectual Property Office, the entire content of which is incorporated herein by reference in its entirety.

BACKGROUND

1. Field

Aspects of embodiments of the present invention relate to a gate driving circuit and a display device including the same.

2. Description of the Related Art

A flat plate display (FPD) (such as a liquid crystal display (LCD), an organic light emitting diode (OLED) display, an electrophoretic display, or a plasma display) includes a plurality of pairs of electric field generating electrodes and electro-optical active layers interposed therebetween. The LCD includes a liquid crystal layer as the electro-optical active layer, and the OLED display includes an organic light emitting layer as the electro-optical active layer. Among the pair of electric field generating electrodes, one may be commonly connected to a switching element to receive an electrical signal. The electro-optical active layer converts the electrical signal into an optical signal to display an image.

The FPD may include a display panel in which thin film transistors (TFTs) are formed. Electrodes of various layers and a semiconductor material are patterned in the TFT display panel. In general, a mask may be utilized for a patterning process.

On the other hand, the semiconductor material is an important factor that determines characteristics of the TFT. Amorphous silicon is widely utilized as a semiconductor material. However, because charge mobility is relatively low, there are limitations on manufacturing a high performance TFT. In addition, when polysilicon is utilized, charge mobility is relatively high so that the high performance TFT may be relatively easily manufactured. However, the price of polysilicon is relatively high and uniformity may be relatively low so that there are limitations on manufacturing a large TFT display plate.

Therefore, research on a TFT (using oxide semiconductor having higher electron mobility than amorphous silicon, an ON/OFF ratio of a current, low price, and high uniformity) is being performed.

The above information disclosed in this Background section is only for enhancement of understanding of the background of the invention and therefore it may contain information that does not constitute prior art.

SUMMARY

Aspects of some embodiments of the present invention relate to a gate driving circuit and a display device including the same.

Aspects of some embodiments of the present invention relate to a liquid crystal display (LCD), and a structure of a gate driving circuit of an LCD.

According to aspects of embodiments of the present invention, a gate driving circuit includes: a plurality of stages configured to output a plurality of gate signals, wherein an Nth (N is a natural number) stage of the plurality of stages includes: an output pull-up unit including a control electrode connected to a first node, wherein the output pull-up unit is configured to increase an electric potential at the first node in response to a control signal of a previous stage of the Nth stage and is further configured to receive a clock signal and to output a gate signal of the Nth stage; a control node pull-up unit configured to charge the first node according to an (N−1)th control signal and an (N−2)th control signal; a control node pull-down unit configured to discharge a voltage of the first node as a first low voltage according to an (N+1)th control signal; and an output pull-down unit configured to discharge a gate signal of the Nth stage as the first low voltage according to the (N+1)th control signal.

The Nth stage may further include a carry unit configured to output a high voltage of the clock signal as an Nth control signal in response to a high voltage being applied to the first node.

The Nth stage may further include an inverter unit configured to output a clock signal to an inverting node in remaining periods excluding a period in which a high voltage of an Nth control signal is output.

The Nth stage may further include a carry maintaining unit configured to discharge a voltage of a carry output terminal of the carry unit outputting the Nth control signal as a second low voltage in response to a signal of the inverting node.

The Nth stage may further include a carry pull-down unit configured to discharge the voltage of the carry output terminal as the second low voltage according to the (N+1)th control signal.

The Nth stage may further include a control node maintaining unit configured to discharge the voltage of the first node as a second low voltage in response to the signal of the inverting node.

The Nth stage may further include an output maintaining unit configured to discharge a voltage of an output node outputting a gate signal of the Nth stage as a first low voltage in response to the signal of the inverting node.

The (N−2)th control signal may have a higher voltage than that of the (N−1)th control signal.

The control node pull-up unit may include a first transistor configured to receive the (N−1)th control signal and a second transistor configured to receive the (N−2)th control signal, and a gate electrode of the first transistor may be connected to an output electrode of the second transistor, an input electrode of the first transistor may be configured to receive the (N−1)th control signal, and an input electrode of the second transistor may be configured to receive the (N−2)th control signal.

The control node pull-up unit may further include a hold capacitor between a gate terminal of the first transistor and an input terminal of the (N−1)th control signal.

The hold capacitor may include a hold transistor.

The control node pull-up unit may further include a third transistor having an input terminal serially connected to the first transistor and an output terminal diode connected to the first node.

The control node pull-up unit may further include a fourth transistor having an input terminal connected to an output terminal of an Nth control signal and an output terminal connected to connection nodes of the first transistor and the third transistor to feedback the Nth control signal.

The Nth stage may further include a carry pull-down unit configured to discharge the voltage of the carry output terminal as a second low voltage according to the (N+2)th control signal.

According to some example embodiments of the present invention, a display device includes: a display panel comprising a display region and a peripheral region, the display region comprising a plurality of gate lines, a plurality of data lines, and a plurality of pixel transistors and a peripheral region surrounding the display region; a data driving circuit configured to output data signals to the data lines; and a plurality of stages at the peripheral region and configured to output gate signals to the gate lines, wherein each stage comprises a gate driving circuit comprising a plurality of transistors, and wherein an Nth (N is a natural number) stage of the plurality of stages comprises: an output pull-up unit including a control electrode connected to a first node, wherein the output pull-up unit is configured to increase an electric potential at the first node in response to a control signal of a previous stage of the Nth stage and is further configured to receive a clock signal and to output a gate signal of the Nth stage; a control node pull-up unit configured to charge the first node according to an (N−1)th control signal and an (N−2)th control signal; a control node pull-down unit configured to discharge a voltage of the first node as a first low voltage according to an (N+1)th control signal; and an output pull-down unit configured to discharge a gate signal of the Nth stage as the first low voltage according to the (N+1)th control signal.

Each of the pixel transistors of the display region and the transistors of the peripheral region may include an oxide semiconductor material.

The control node pull-up unit may include a first transistor configured to receive the (N−1)th control signal and a second transistor configured to receive the (N−2)th control signal, and a gate electrode of the first transistor may be connected to an output electrode of the second transistor, an input electrode of the first transistor may be configured to receive the (N−1)th control signal, and an input electrode of the second transistor may be configured to receive the (N−2)th control signal.

The control node pull-up unit may further include a hold capacitor between a gate terminal of the first transistor and an input terminal of the (N−1)th control signal.

The control node pull-up unit may further include a third transistor having an input terminal serially connected to the first transistor and an output terminal diode connected to the first node.

The control node pull-up unit may further include a fourth transistor having an input terminal connected to an output terminal of an Nth control signal and an output terminal connected to connection nodes of the first transistor and the third transistor to feedback the Nth control signal.

BRIEF DESCRIPTION OF THE DRAWINGS

These and/or other aspects will become more apparent and more readily appreciated from the following description of the example embodiments, taken in conjunction with the accompanying drawings in which.

DETAILED DESCRIPTION

Figure 1:
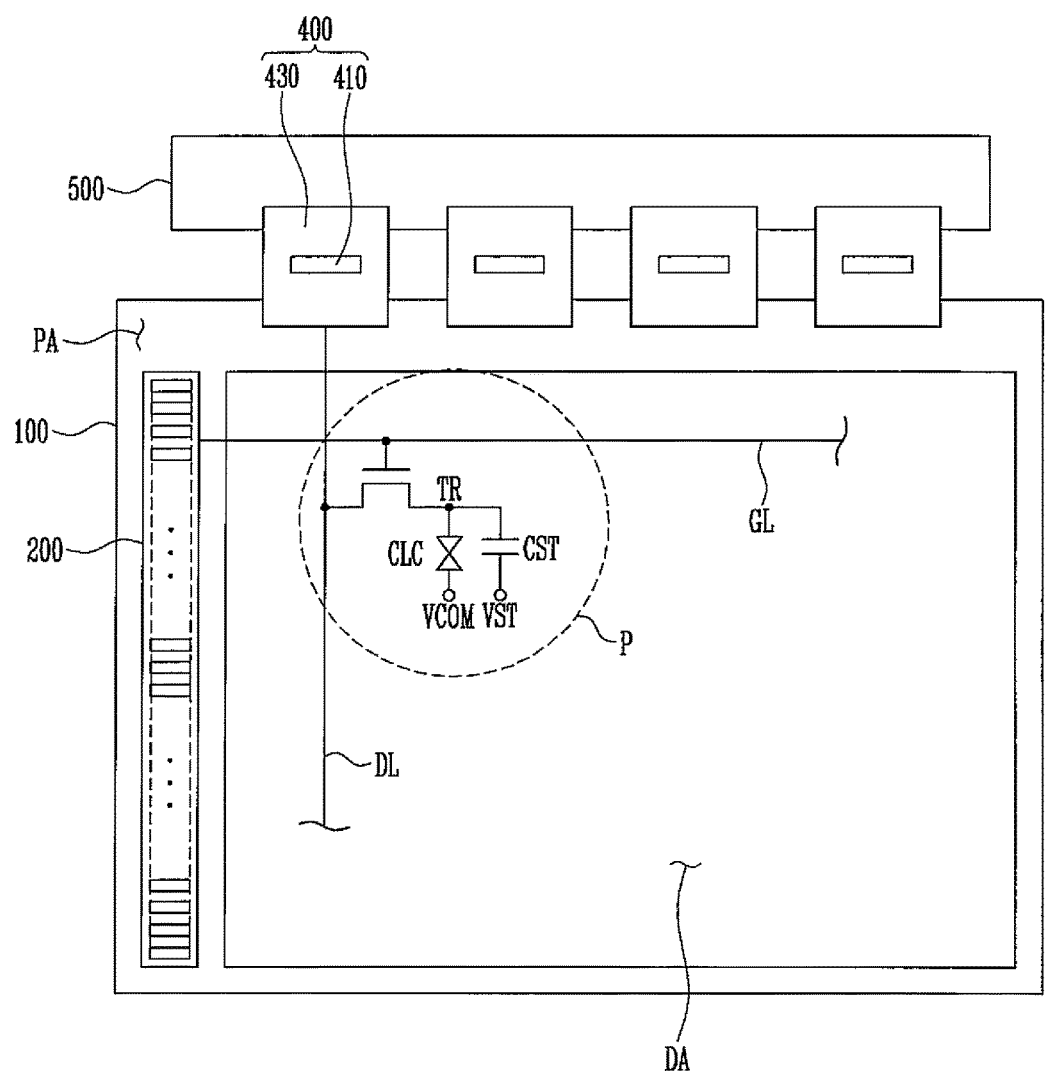
FIG. 1 is a plan view of a display device according to some example embodiments of the present invention.

Hereinafter, example embodiments will be described in more detail with reference to the accompanying drawings, in which like reference numbers refer to like elements throughout. The present invention, however, may be embodied in various different forms, and should not be construed as being limited to only the illustrated embodiments herein. Rather, these embodiments are provided as examples so that this disclosure will be thorough and complete, and will fully convey the aspects and features of the present invention to those skilled in the art. Accordingly, processes, elements, and techniques that are not necessary to those having ordinary skill in the art for a complete understanding of the aspects and features of the present invention may not be described. Unless otherwise noted, like reference numerals denote like elements throughout the attached drawings and the written description, and thus, descriptions thereof will not be repeated. In the drawings, the relative sizes of elements, layers, and regions may be exaggerated for clarity.

In the current specification, a transistor element utilized for a driving circuit may include three electrodes that may be referred to as a control electrode, an input electrode, and an output electrode. In various embodiments, the control electrode may be a gate electrode of the transistor element, the input electrode may be a source electrode of the transistor element, and the output electrode may be a drain electrode of the transistor element.

In addition, in the current specification, a Q node may be utilized with a control node.

FIG. 1 is a plan view of a display device according to an embodiment of the present invention.

Referring to FIG. 1, the display device includes a display panel 100, a gate driving circuit 200, a data driving circuit 400, and a printed circuit board (PCB).

The display panel 100 includes a display region DA and a peripheral region PA that surrounds the display region DA (e.g., outside a footprint of the display region DA). In the display region DA, gate lines, data lines, and a plurality of pixel units that intersect (e.g., cross) each other are provided or arranged. Each pixel unit P includes a pixel transistor TR electrically connected to a gate line GL and a data line DL, a liquid crystal capacitor CLC electrically connected to the pixel transistor TR, and a storage capacitor CST connected to the liquid crystal capacitor CLC in parallel. The pixel transistor TR may be an oxide transistor that uses oxide semiconductor as an active layer. The oxide semiconductor may be formed of an amorphous oxide including at least one of indium (In), zinc (Zn), gallium (Ga), tin (Sn), and hafnium (Hf). For example, the pixel transistor TR may be formed of an amorphous oxide including In, Zn, and Ga or an amorphous oxide including In, Zn, and Hf. The oxide semiconductor may include an oxide such as InZnO, InGaO, InSnO, ZnSnO, GaSnO, and GaZnO. For example, an active pattern ACT may include indium gallium zinc oxide (IGZO).

The gate driving circuit 200 includes a shift register for sequentially outputting high voltage gate signals to the gate lines. The shift register may include a plurality of stages. The gate driving circuit 200 is integrated with the peripheral region PA corresponding to one end of each of the gate lines. The gate driving circuit 200 includes a plurality of circuit transistors, and the circuit transistor is formed in the peripheral region PA in the same process as the pixel transistor TR. The circuit transistor may be an oxide transistor that uses the oxide semiconductor as an active layer. The gate driving circuit 200 may be formed at both ends of the gate lines in a dual structure.

The data driving circuit 400 includes a data driving chip 410, for outputting data signals to the data lines and a flexible printed circuit board (FPCB) 430 in which the data driving chip 410 is mounted to electrically connect the PCB 500 and the display panel 100.

Figure 2:
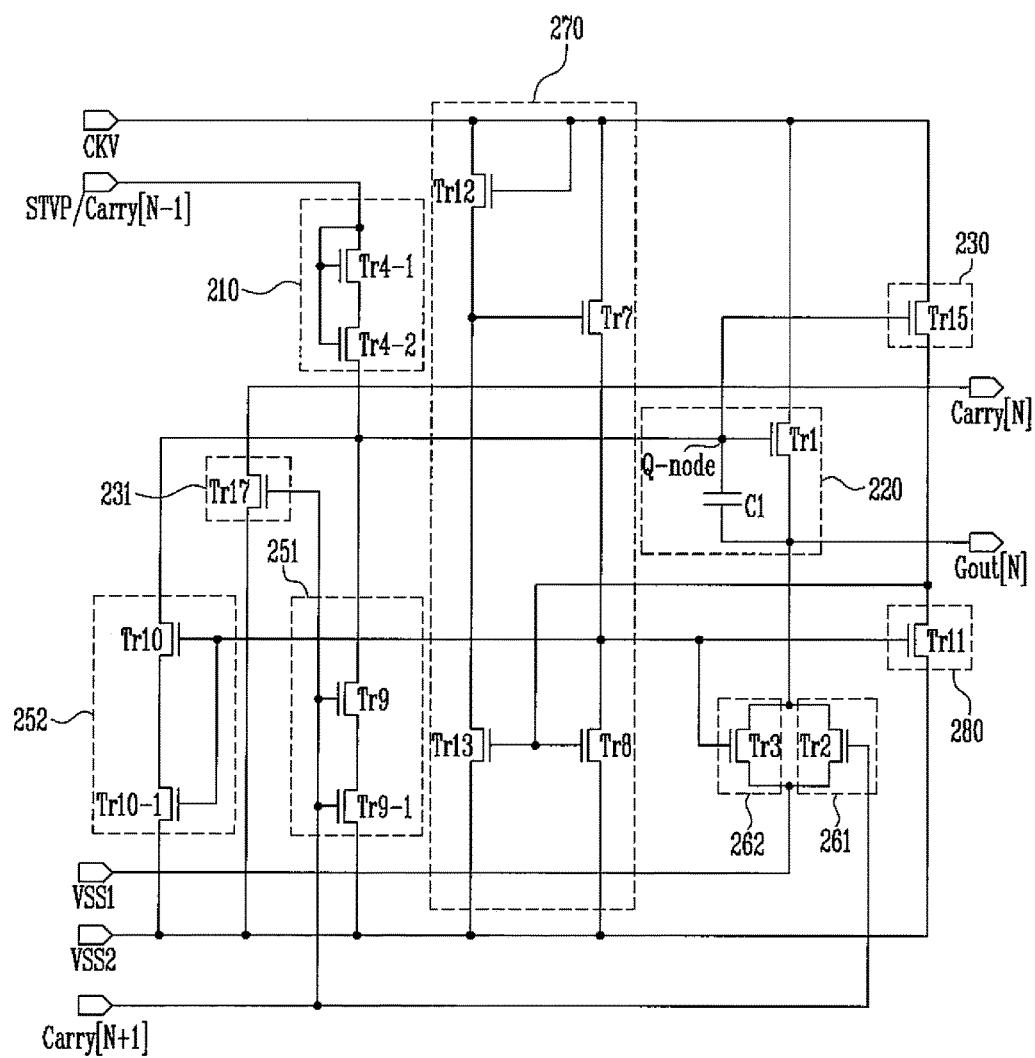
FIG. 2 is a circuit diagram of a structure of a related art gate driving circuit.

FIG. 2 is a circuit diagram of a structure of a related art gate driving circuit.

The gate circuit structure of FIG. 2 is a circuit structure for obtaining a robust operation characteristic required by a gate integrated circuit (IC) to which oxide semiconductor (an oxide thin film transistor (TFT)) is applied and reducing power consumption. For example, in a related art amorphous silicon gate (ASG) circuit structure, a circuit structure of a TFT that receives high level stress is changed so that the TFT receives low level stress and circuit integration efficiency may increase.

In addition, power consumption may be reduced in the gate driving circuit structure of FIG. 2. That is, a problem in which a current leaks to a hold transistor (a hold TFT) so that power consumption increases due to a depletion characteristic of an oxide may be solved (or reduced) by a serial TFT arrangement structure.

An operation of the gate driving circuit of FIG. 2 will be described. The gate driving circuit 200 includes a shift register including a plurality of dependently connected stages.

Referring to FIG. 2, an Nth stage of the gate driving circuit 200 according to the embodiment of the present invention includes a Q node pull-up unit 210, an output pull-up unit 220, a carry unit 230, a carry pull-down unit 231, a Q node pull-down unit 251, a Q node maintaining unit 252, an output pull-down unit 261, an output maintaining unit 262, an inverter 270, and a carry maintaining unit 280.

The Q node pull-up unit 210 transmits an (N−1)th carry signal to the output pull-up unit 220. When a high voltage of the (N−1)th carry signal is received (e.g., in response to a high voltage level of the (N−1)th carry signal being received), the Q node pull-up unit 210 applies a first voltage V1 corresponding to the high voltage to a Q node. The Q node pull-up unit 210 may include a fourth transistor Tr4. The fourth transistor Tr4 includes an upper end transistor Tr4-1 connected to an (N−1)th carry input terminal IN1 and a lower end transistor Tr4-2 serially connected to the upper end transistor Tr4-1. An output electrode of the lower end transistor Tr4-2 is connected to the Q node.

The output pull-up unit 220 outputs an Nth gate signal. The output pull-up unit 220 includes a first transistor Tr1. The first transistor Tr1 includes a control electrode connected to the control node (the Q node), an input electrode connected to a clock terminal CKV, and an output electrode connected to an output node Gout[N]. And, the output pull-up unit 220 includes a capacitor C1 connected between the control node (the Q node) and the output node Gout[N].

When a high voltage of a clock signal is received by the clock terminal CKV (e.g., in response to a high voltage level of a clock signal being received) in a state in which the first voltage V1 of the control node (the Q node) is applied to the control electrode of the output pull-up unit 220, the control node (the Q node) is boosted up from the first voltage V1 to a boosting voltage VBT. That is, the control node (the Q node) has the first voltage V1 in an (N−1)th period and has the boosting voltage VBT in an Nth period.

In a period in which the boosting voltage VBT is applied to the control electrode of the output pull-up unit 220, the output pull-up unit 220 outputs the high voltage of the clock signal as a high voltage of the Nth gate signal. The Nth gate signal is output through a terminal connected to the output node Gout[N].

The carry unit 230 outputs an Nth carry signal. The carry unit 230 includes a 15$^{th}$ transistor Tr15. The 15$^{th}$ transistor Tr15 includes a control electrode connected to the control node (the Q node), an input electrode connected to the clock terminal CKV, and an output electrode connected to a carry output node Carry[N].

When a high voltage is applied to the control node (the Q node) (e.g., in response to a high voltage level being applied to the control node), the carry unit 230 outputs the high voltage of the clock signal received by the clock terminal CKV as the Nth carry signal. The Nth carry signal is output through a terminal connected to the carry output node Carry[N].

The carry pull-down unit 231 may discharge a voltage of the carry output node Carry[N] as a second low voltage VSS2. For example, the carry pull-down unit 231 includes a 17$^{th}$ transistor Tr17. A control electrode of the 17$^{th}$ transistor Tr17 is connected to a Q node pull-down unit 251 and an input electrode of the 17$^{th}$ transistor Tr17 may be connected to a second low voltage VSS2 terminal, and an output electrode of the 17$^{th}$ transistor Tr17 may be connected to the carry output node Carry[N].

The Q node pull-down unit 251 and the Q node maintaining unit 252 sequentially discharge a voltage of the control node (the Q node) as a first low voltage VSS1 and the second low voltage VSS2 in response to an (N+1)th carry signal and an output of an inverting node.

The Q node pull-down unit 251 includes a ninth transistor Tr9. In various embodiments, the Q node pull-down unit 251 may have a front-right-top (FRT) structure in which two transistors Tr9 and Tr9-1 are serially connected. Control electrodes of the ninth transistor Tr9 and a (9-1)th transistor Tr9-1 are connected to the (N+1)th carry signal, an input terminal of the ninth transistor Tr9 is connected to the Q node, and an output terminal of the (9-1)th transistor Tr9-1 is connected to the second low voltage VSS2 terminal.

When a high voltage of the (N+1)th carry signal is applied (e.g., in response to a high voltage level of the (N+1)th carry signal being applied) to an (N+1)th carry input terminal Carry[N+1] in an (N+1)th period, the ninth transistor Tr9 and the (9-1)th transistor Tr9-1 discharge the voltage of the control node (the Q node) as the first low voltage VSS1. The second low voltage VSS2 is applied to the ninth transistor Tr9 and the (9-1)th transistor Tr9-1 in remaining periods excluding the (N+1)th period.

The Q node maintaining unit 252 maintains the voltage of the control node Q. The Q node maintaining unit 252 includes a tenth transistor Tr10. In various embodiments, the Q node maintaining unit 252 may have the FRT structure in which two transistors Tr10 and Tr10-1 are serially connected. The tenth transistor Tr10 and a (10-1)th transistor Tr10-1 include control electrodes connected to the inverting node. One terminal of the tenth transistor Tr10 is connected to the Q node and the (10-1)th transistor Tr10-1 is connected to the second low voltage VSS2 terminal. The Q node maintaining unit 252 maintains the voltage of the control node (the Q node) as the second low voltage VSS2 in response to a signal of the inverting node in remaining periods of a frame.

The output pull-down unit 261 pulls down the Nth gate signal. The output pull-down unit 261 includes a second transistor Tr2. The second transistor Tr2 includes a control electrode to which the (N+1)th carry signal is input, an input electrode connected to the output node Gout[N], and an output electrode connected to the first low voltage VSS1 terminal. When the (N+1)th carry signal is input (e.g., in response to the (N+1)th carry signal being input), the output pull-down unit 261 pulls down a voltage of the output node Gout[N] to the first low voltage VSS1.

The output maintaining unit 262 maintains the voltage of the output node Gout[N]. The output maintaining unit 262 includes a third transistor Tr3. The third transistor Tr3 includes a control electrode connected to the inverting node, an input electrode connected to the output node Gout[N] and an output electrode connected to a first voltage terminal VT1. The output maintaining unit 262 maintains the voltage of the output node Gout[N] as the first low voltage VSS1 in response to the signal of the inverting node.

The inverter 270 may output a signal having the same phase as the clock signal received by the clock terminal CKV to the inverting node in the remaining periods of the frame excluding a period in which a high signal of the Nth carry signal is output. The inverter 270 includes a 12$^{th}$ transistor Tr12, a seventh transistor Tr7, a 13$^{th}$ transistor Tr13, and an eighth transistor Tr8.

The 12$^{th}$ transistor Tr12 includes a control electrode and an input electrode that are connected to the clock terminal CKV and an output electrode connected to an input electrode of the 13$^{th}$ transistor Tr13 and the seventh transistor Tr7. The seventh transistor Tr7 includes a control electrode connected to the 13$^{th}$ transistor Tr13, an input electrode connected to the clock terminal CKV, and an output electrode connected to an input electrode of the eighth transistor Tr8. The output electrode of the seventh transistor Tr7 is connected to the inverting node. The 13$^{th}$ transistor Tr13 includes a control electrode connected to the carry output node Carry[N], an input electrode connected to the 12$^{th}$ transistor Tr12, and an output electrode connected to the first low voltage VSS1 terminal. The eighth transistor Tr8 includes a control electrode connected to the carry output node Carry[N], an input electrode connected to the inverting node, and an output electrode connected to the first low voltage VSS1 terminal.

The inverter 270 discharges the clock signal input to the clock terminal CKV as the first low voltage VSS1 in a period in which a high voltage is applied to the carry output node Carry[N]. That is, the eighth and 13$^{th}$ transistors are turned on in response to a high voltage of the carry output node Carry[N] so that the clock signal is discharged as the first low voltage VSS1.

The carry maintaining unit 280 maintains the voltage of the carry output node Carry[N]. The carry maintaining unit 280 includes an 11$^{th}$ transistor Tr11. The 11$^{th}$ transistor Tr11 includes a control electrode connected to the inverting node, an input electrode connected to the carry output node Carry[N], and an output electrode connected to the second low voltage VSS2 terminal. The carry maintaining unit 280 maintains the voltage of the carry output node Carry[N] as the second low voltage VSS2 in response to the signal of the inverting node in the remaining periods of the frame.

In the gate driving circuit of FIG. 2, when a node that receives high voltage stress among the transistors connected to the Q node in a gate integrated circuit is a source (for example, the fourth transistor Tr4), an on current of a transistor Tr is reduced in accordance with stress time so that an element may deteriorate. In addition, due to reduction in the on current of the fourth transistor Tr4, an output of the Q node is insufficient so that 100% of a data voltage may not be applied to a pixel. In order to solve (or reduce) the problem, an additional transistor may be diode serially connected.

In this case, the same current driving ability may be provided. However, because a width of the fourth transistor Tr4 must increase no less than two times, a size of Bezel must increase.

According to the present invention, a circuit structure, in which a higher voltage is applied to a gate of the fourth transistor Tr4 of the Q node pull-up unit 210 and a lower end transistor is connected in a diode structure, may be utilized.

Figure 3:
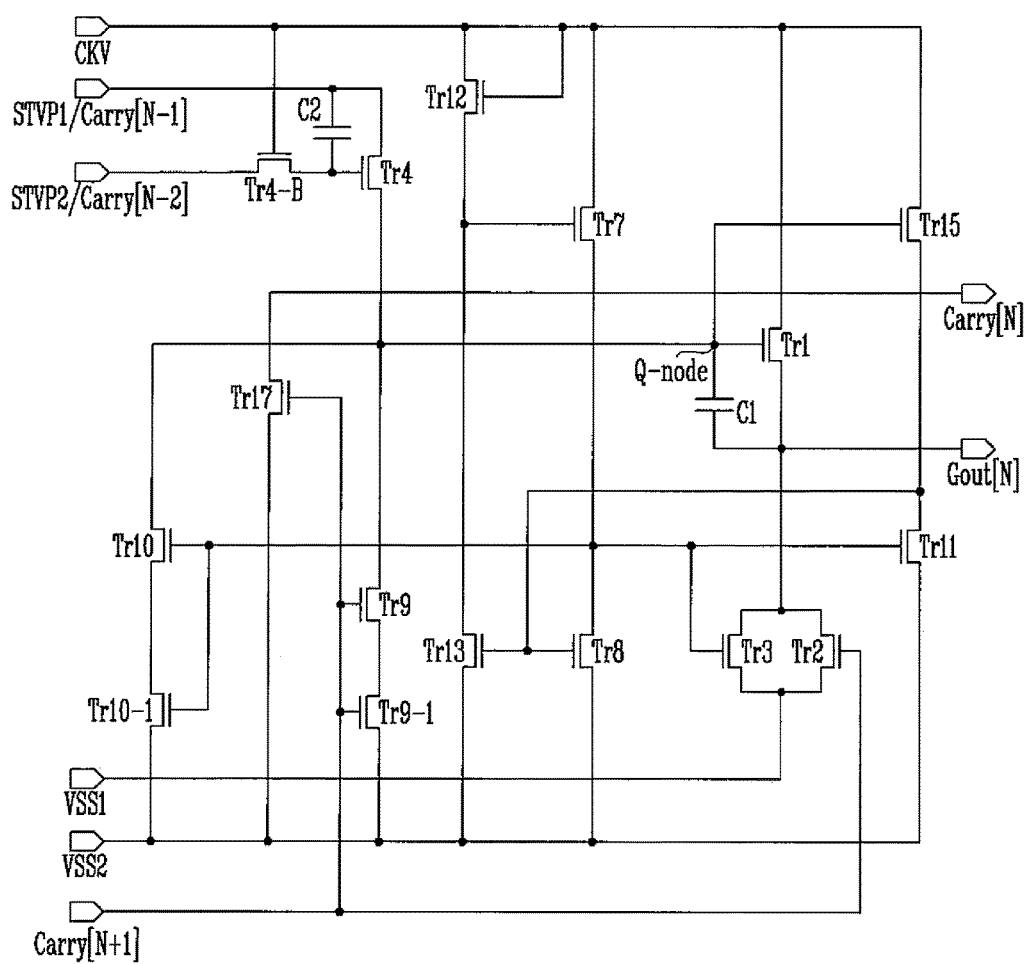
FIG. 3 is a circuit diagram of a gate driving circuit according to some example embodiments of the present invention.

FIG. 3 is a circuit diagram of a gate driving circuit according to an embodiment of the present invention.

Referring to FIG. 3, in a gate driving circuit of an Nth stage, an (N−1)th carry signal and an (N−2)th carry signal may be utilized for charging a Q node. For example, in FIG. 3, in the circuit structure of FIG. 2, the Q node pull-up unit 210 is formed of the fourth transistor Tr4 and a (4-B)th transistor Tr4-B. In addition, the (N−1)th carry signal is input to the fourth transistor Tr4, the (N−2)th carry signal is input to the (4-B)th transistor Tr4-B, and a capacitor C2 is connected between the two transistors.

Figure 4:
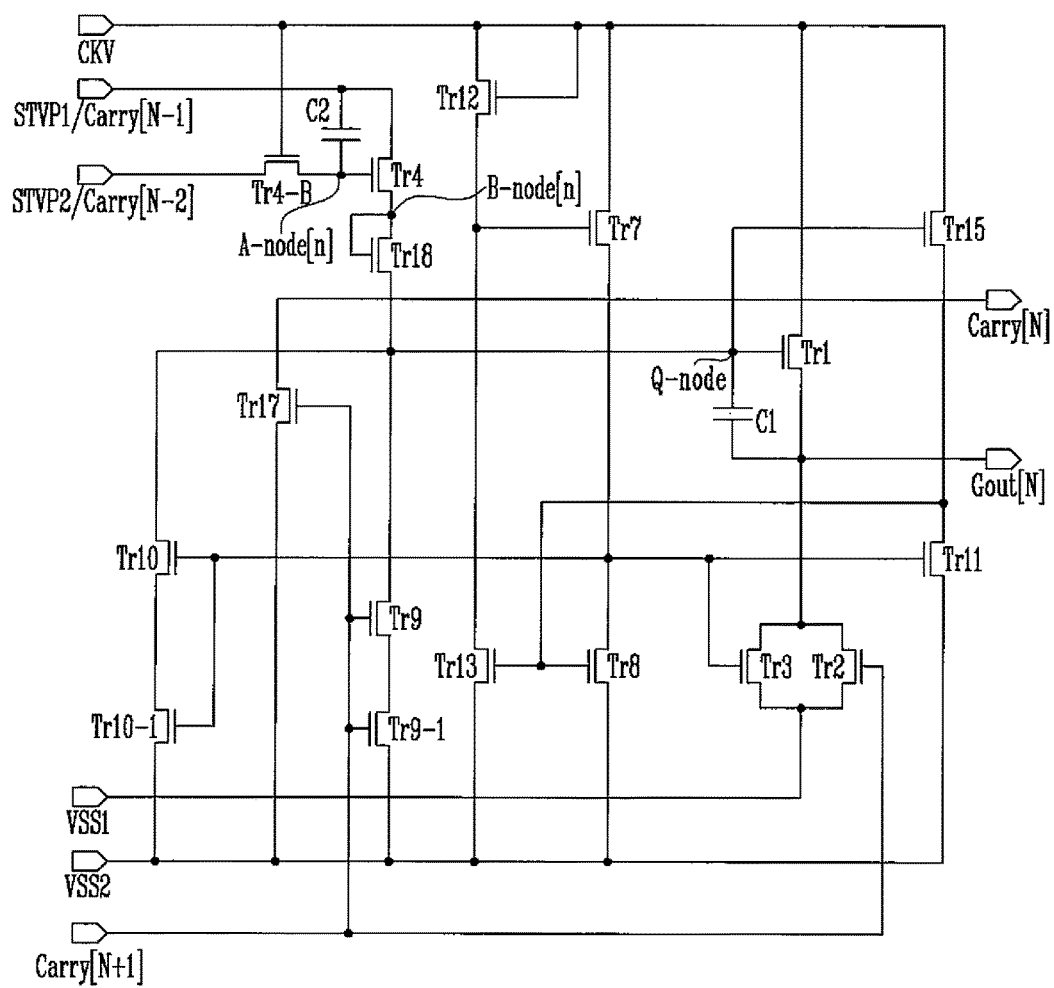
FIG. 4 is a circuit diagram of a gate driving circuit according to some example embodiments of the present invention.

FIG. 4 is a circuit diagram of a gate driving circuit according to another embodiment of the present invention.

In FIG. 4, in the Q node pull-up unit 210 of FIG. 3, a lower end transistor Tr18 in a diode structure is further provided at a lower end of the fourth transistor Tr4.

In the circuit structure of FIG. 4, in accordance with a current calculating equation of a transistor Tr, current ability of the fourth transistor Tr4 of the Q node pull-up unit 210 may be improved to be proportional to an input voltage in a linear mode region and to be proportional to a square of an input voltage in a saturation mode region. In addition, as illustrated in FIG. 4, the lower end transistor Tr18 is connected to the lower end of the fourth transistor Tr4 in the diode structure so that reliability of an oxide semiconductor gate (OSG) circuit may be improved by reduction in voltage stress applied to the fourth transistor Tr4.

Figure 5:
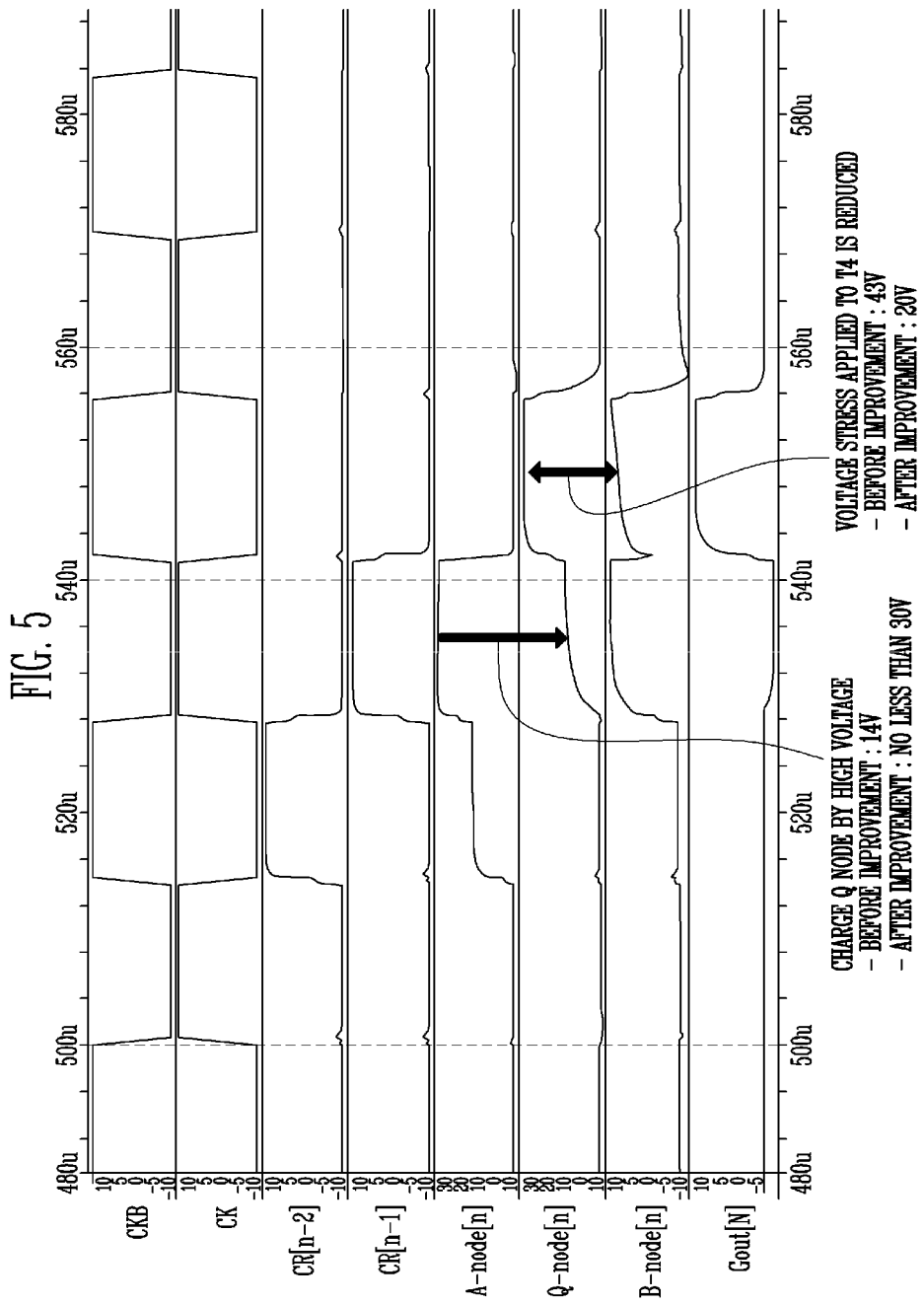
FIG. 5 is a graph illustrating input and output waveforms of a gate driving circuit according to some example embodiments of the present invention.

FIG. 5 is a graph illustrating input and output waveforms of a gate driving circuit according to the present invention.

Referring to FIG. 5, input signals are a clock CK, an inverted clock CKB, an (N−2)th carry signal CR[n−2], and an (N−1)th carry signal CR[n−1] and outputs are outputs of an A node, a Q node, and a B node and a gate output signal Gout[n].

It is noted from FIG. 5 that the Q node is charged by a high voltage and the voltage of the Q node is increased from 14V to no less than 30V in comparison with FIG. 2 that illustrates a related art circuit. In addition, when the output of the Q node is compared with the output of the B node, it is noted that voltage stress applied to the Q node pull-up unit 210 is reduced from 43V to 20V.

Figure 6:
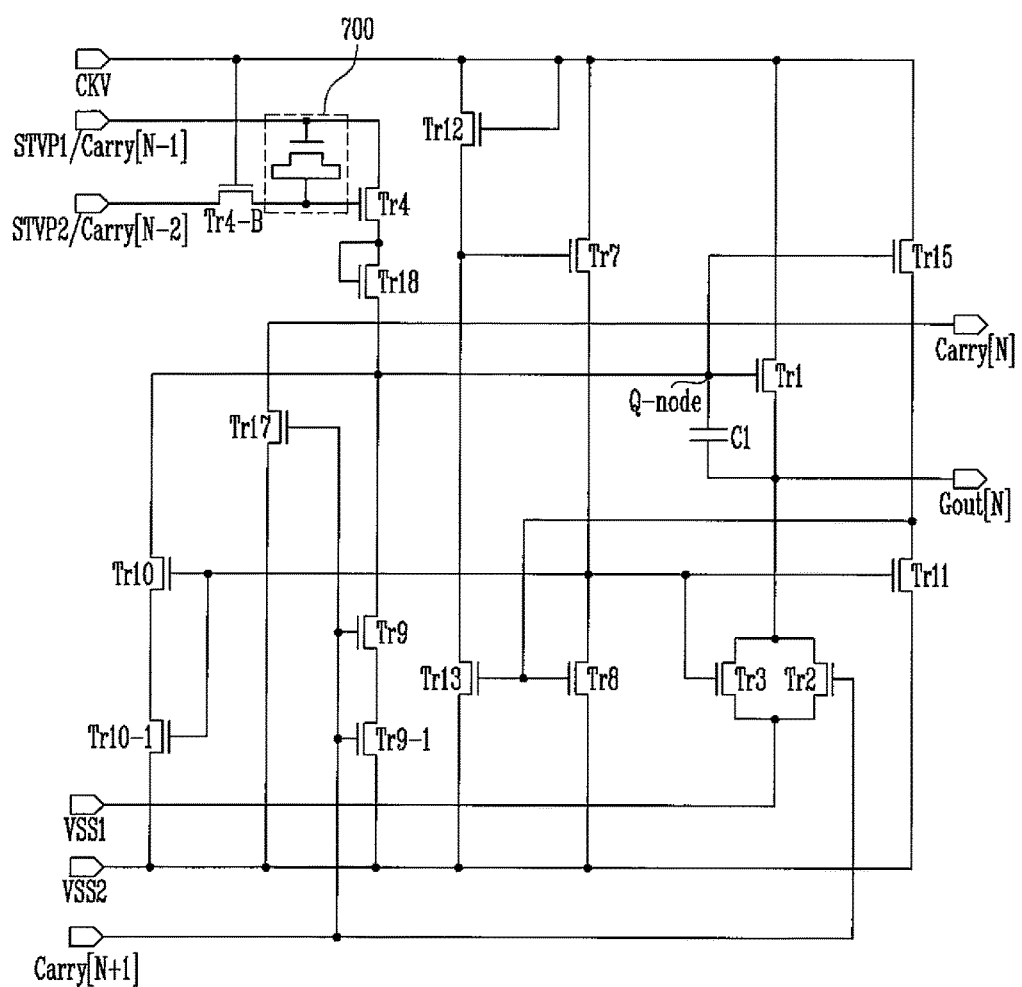
FIG. 6 is a circuit diagram of a gate driving circuit according to some example embodiments of the present invention.

FIG. 6 is a circuit diagram of a gate driving circuit according to another embodiment of the present invention.

Referring to FIG. 6, the Q node pull-up unit 210 is similar to the structure illustrated in FIG. 4, with an exception of an additional transistor 700 being utilized instead of the capacitor.

Figure 7:
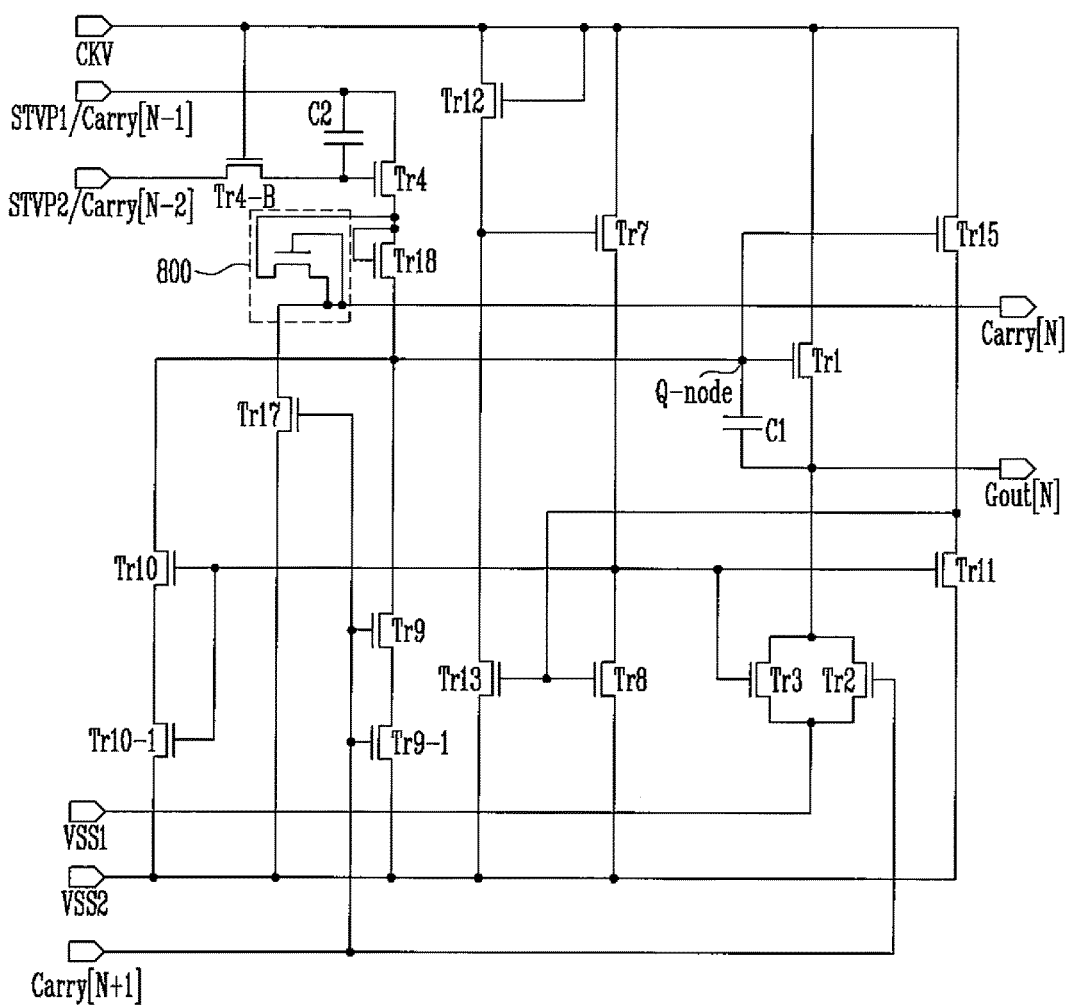
FIG. 7 is a circuit diagram of a gate driving circuit according to some example embodiments of the present invention.

FIG. 7 is a circuit diagram of a gate driving circuit according to another embodiment of the present invention.

Referring to FIG. 7, in order to reduce the voltage stress applied to the Q node pull-up unit 210, the Nth carry signal is fed back and may be applied to a lower end node of the fourth transistor Tr4. For this purpose, a feedback transistor 800 may be further provided. One terminal of the feedback transistor 800 is diode connected to an Nth carry signal terminal and the other terminal of the feedback transistor 800 may be connected to the lower end node of the fourth transistor Tr4.

Figure 8:
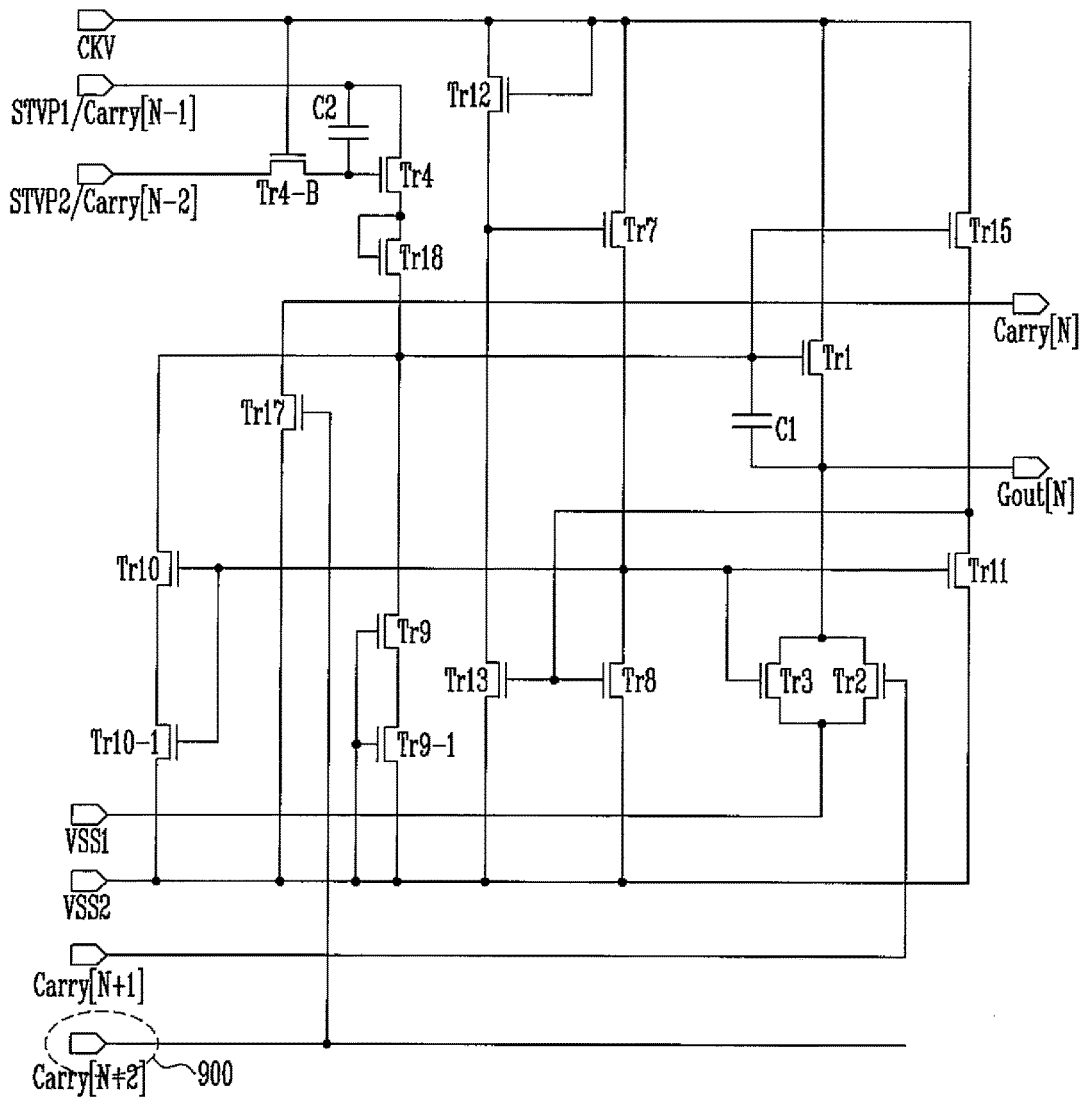
FIG. 8 is a circuit diagram of a gate driving circuit according to some example embodiments of the present invention.

FIG. 8 is a circuit diagram of a gate driving circuit according to another embodiment of the present invention.

Referring to FIG. 8, an (N+2)th carry signal input terminal Carry[N+2] is further provided and an (N+2)th carry signal is input to a gate terminal of the $17^{th}$ transistor Tr17 so that discharge is maintained until an (N+2) period and ripple of a carry node may be reduced.

In various embodiments, the Nth carry signal, the (N−1)th carry signal, and the (N−2)th carry signal that are utilized for the gate driving circuits of FIGS. 2 to 9 may be respectively replaced by the Nth gate signal, an (N−1)th gate signal, and an (N−2)th gate signal.

By way of summation and review, and according to some example embodiments, in order to reduce a size of a display panel and increase productivity, a method of integrating a gate driving circuit for outputting gate signals supplied to gate lines formed in the display panel into the display panel is utilized. The gate driving circuit integrated into the display panel includes thin film transistors (TFT) manufactured by the same process as TFTs of pixels. Therefore, in the TFT of the gate driving circuit, an active layer is formed of oxide semiconductor. According to some example embodiments, in order to improve reliability of the gate integrated circuit using the oxide semiconductor, there is provided the gate driving circuit in which an (N−1)th carry signal (a first trigger signal) and an (N−2)th carry signal (a second trigger signal) that are utilized for charging a Q node, and a capacitor is inserted between the (N−1)th carry signal (the first trigger signal) and the (N−2)th carry signal (the second trigger signal).

In various embodiments of the present invention, in the gate driving circuit, voltage stress applied to a pull-up unit of the Q node may be reduced. In addition, it is possible to reduce a size of the Q node pull-up unit so that it is possible to reduce a Bezel size and power consumption.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present invention.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

It will be understood that when an element or layer is referred to as being "on," "connected to," or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments only and is not intended to be limiting of the present invention. As used herein, the singular forms "a" and "an" are intended to include the plural forms as well, unless the context clearly indicates otherwise. It will be further understood that the terms "comprises," "comprising," "includes," and "including," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list.

As used herein, the term "substantially," "about," and similar terms are used as terms of approximation and not as terms of degree, and are intended to account for the inherent deviations in measured or calculated values that would be recognized by those of ordinary skill in the art. Further, the use of "may" when describing embodiments of the present invention refers to "one or more embodiments of the present invention." As used herein, the terms "use," "using," and "used" may be considered synonymous with the terms "utilize," "utilizing," and "utilized," respectively. Also, the term "exemplary" is intended to refer to an example or illustration.

The electronic or electric devices and/or any other relevant devices or components according to embodiments of the present invention described herein may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate. Further, the various components of these devices may be may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the exemplary embodiments of the present invention.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims, and their equivalents.

What is claimed is:

1. A gate driving circuit comprises:
    a plurality of stages configured to output a plurality of gate signals, wherein an Nth (N is a natural number) stage of the plurality of stages comprises:
    an output pull-up unit comprising a control electrode connected to a first node, wherein the output pull-up unit is configured to increase an electric potential at the first node in response to a control signal of a previous stage of the Nth stage and is further configured to receive a clock signal and to output a gate signal of the Nth stage;
    a control node pull-up unit configured to charge the first node according to an (N−1)th control signal and an (N−2)th control signal;
    a control node pull-down unit configured to discharge a voltage of the first node as a first low voltage according to an (N+1)th control signal; and
    an output pull-down unit configured to discharge a gate signal of the Nth stage as the first low voltage according to the (N+1)th control signal.

2. The gate driving circuit of claim 1, wherein the Nth stage further comprises a carry unit configured to output a high voltage of the clock signal as an Nth control signal in response to a high voltage being applied to the first node.

3. The gate driving circuit of claim 1, wherein the Nth stage further comprises an inverter unit configured to output a clock signal to an inverting node in remaining periods excluding a period in which a high voltage of an Nth control signal is output.

4. The gate driving circuit of claim 3, wherein the Nth stage further comprises a carry maintaining unit configured to discharge a voltage of a carry output terminal of the carry maintaining unit outputting the Nth control signal as a second low voltage in response to a signal of the inverting node.

5. The gate driving circuit of claim 4, wherein the Nth stage further comprises a carry pull-down unit configured to discharge the voltage of the carry output terminal as the second low voltage according to the (N+1)th control signal.

6. The gate driving circuit of claim 4, wherein the Nth stage further comprises a carry pull-down unit configured to discharge the voltage of the carry output terminal as a second low voltage according to the (N+2)th control signal.

7. The gate driving circuit of claim 3, wherein the Nth stage further comprises a control node maintaining unit configured to discharge the voltage of the first node as a second low voltage in response to a signal of the inverting node.

8. The gate driving circuit of claim 3, wherein the Nth stage further comprises an output maintaining unit configured to discharge a voltage of an output node outputting a gate signal of the Nth stage as a first low voltage in response to the signal of the inverting node.

9. The gate driving circuit of claim 1, wherein the (N−2)th control signal has a higher voltage than that of the (N−1)th control signal.

10. The gate driving circuit of claim 1,
    wherein the control node pull-up unit comprises a first transistor configured to receive the (N−1)th control signal and a second transistor configured to receive the (N−2)th control signal,
    wherein a gate electrode of the first transistor is connected to an output electrode of the second transistor, an input electrode of the first transistor is configured to receive the (N−1)th control signal, and an input electrode of the second transistor is configured to receive the (N−2)th control signal.

11. The gate driving circuit of claim 10, wherein the control node pull-up unit further comprises a hold capacitor between a gate terminal of the first transistor and an input terminal of the (N−1)th control signal.

12. The gate driving circuit of claim 11, wherein the control node pull-up unit further comprises a third transistor having an input terminal serially connected to the first transistor and an output terminal diode connected to the first node.

13. The gate driving circuit of claim 12, wherein the control node pull-up unit further comprises a fourth transistor having an input terminal connected to an (N−1)th carry input terminal and an output terminal connected to a gate electrode of the first transistor.

14. A display device comprising:
    a display panel comprising a display region and a peripheral region, the display region comprising a plurality of gate lines, a plurality of data lines, and a plurality of pixel transistors, and the peripheral region surrounding the display region;
    a data driving circuit configured to output data signals to the data lines; and
    a plurality of stages at the peripheral region and configured to output gate signals to the gate lines,
    wherein each stage comprises a gate driving circuit comprising a plurality of transistors, and
    wherein an Nth (N is a natural number) stage of the plurality of stages comprises:

an output pull-up unit including a control electrode connected to a first node, wherein the output pull-up unit is configured to increase an electric potential at the first node in response to a control signal of a previous stage of the Nth stage and is further configured to receive a clock signal and to output a gate signal of the Nth stage;

a control node pull-up unit configured to charge the first node according to an (N−1)th control signal and an (N−2)th control signal;

a control node pull-down unit configured to discharge a voltage of the first node as a first low voltage according to an (N+1)th control signal; and an output pull-down unit configured to discharge a gate signal of the Nth stage as the first low voltage according to the (N+1)th control signal.

15. The display device of claim 14, wherein each of the pixel transistors of the display region and the transistors of the peripheral region comprise an oxide semiconductor material.

16. The display device of claim 14, wherein the control node pull-up unit comprises a first transistor configured to receive the (N−1)th control signal and a second transistor configured to receive the (N−2)th control signal, wherein a gate electrode of the first transistor is connected to an output electrode of the second transistor, an input electrode of the first transistor is configured to receive the (N−1)th control signal, and an input electrode of the second transistor is configured to receive the (N−2)th control signal.

17. The display device of claim 16, wherein the control node pull-up unit further comprises a hold capacitor between a gate terminal of the first transistor and an input terminal of the (N−1)th control signal.

18. The display device of claim 16, wherein the control node pull-up unit further comprises a third transistor having an input terminal serially connected to the first transistor and an output terminal diode connected to the first node.

19. The display device of claim 18, wherein the control node pull-up unit further comprises a fourth transistor having an input terminal connected to an output terminal of an Nth control signal and an output terminal connected to connection nodes of the first transistor and the third transistor to feedback the Nth control signal.

* * * * *